United States Patent
Jang et al.

(10) Patent No.: US 10,014,073 B2
(45) Date of Patent: Jul. 3, 2018

(54) SEMICONDUCTOR DEVICES

(71) Applicant: SK hynix Inc., Icheon-si, Gyeonggi-do (KR)

(72) Inventors: Mun Seon Jang, Seoul (KR); Saeng Hwan Kim, Suwon-si (KR); In Tae Kim, Icheon-si (KR); Chang Ki Baek, Anyang-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 84 days.

(21) Appl. No.: 15/371,917

(22) Filed: Dec. 7, 2016

(65) Prior Publication Data

US 2017/0372796 A1 Dec. 28, 2017

(30) Foreign Application Priority Data

Jun. 23, 2016 (KR) .................... 10-2016-0078816

(51) Int. Cl.
| | |
|---|---|
| *G11C 29/00* | (2006.01) |
| *G11C 29/42* | (2006.01) |
| *G11C 29/36* | (2006.01) |
| *G06F 11/10* | (2006.01) |
| *G11C 29/52* | (2006.01) |

(52) U.S. Cl.
CPC .......... *G11C 29/42* (2013.01); *G06F 11/1068* (2013.01); *G11C 29/36* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 3,909,721 A * | 9/1975 | Bussgang | ............. | H03M 13/35 375/280 |
| 4,998,253 A * | 3/1991 | Ohashi | ................. | H03M 13/39 714/791 |
| 6,032,283 A * | 2/2000 | Meyer | ................. | H03M 13/151 714/746 |
| 6,041,368 A * | 3/2000 | Nakatsuji | ............ | G06F 11/1008 710/20 |
| 6,332,206 B1 * | 12/2001 | Nakatsuji | ............... | G11B 20/18 714/755 |
| 6,470,473 B1 * | 10/2002 | Iwasa | ................. | G11B 20/1803 714/785 |

(Continued)

FOREIGN PATENT DOCUMENTS

KR 10-2001-0062640 A 7/2001

*Primary Examiner* — Guerrier Merant
(74) *Attorney, Agent, or Firm* — William Park & Associates Ltd.

(57) ABSTRACT

A semiconductor device may include a syndrome generation circuit and a failure detection circuit. The syndrome generation circuit may generate a syndrome signal corresponding to a pattern of an output data signal. The failure detection circuit may detect the syndrome signal and sequentially store the syndrome signal to generate a first syndrome signal and a second syndrome signal if an error is detected from the syndrome signal. The failure detection circuit may generate a failure detection signal which is enabled if a logic level combination of the first syndrome signal is different from a logic level combination of the second syndrome signal.

20 Claims, 6 Drawing Sheets

(56) References Cited

U.S. PATENT DOCUMENTS

| | | | |
|---|---|---|---|
| 6,697,989 B1* | 2/2004 | Maeda | G11B 20/1833 |
| | | | 714/755 |
| 2007/0245220 A1* | 10/2007 | Ito | G11B 20/1833 |
| | | | 714/782 |
| 2008/0201620 A1* | 8/2008 | Gollub | G06F 11/1044 |
| | | | 714/718 |
| 2008/0320372 A1* | 12/2008 | Ryu | H03M 13/1515 |
| | | | 714/784 |
| 2009/0187809 A1* | 7/2009 | Fekih-Romdhane | G06F 11/1008 |
| | | | 714/763 |
| 2009/0292968 A1* | 11/2009 | Cypher | G06F 11/10 |
| | | | 714/755 |
| 2011/0239091 A1* | 9/2011 | Toda | H03M 13/138 |
| | | | 714/767 |
| 2012/0173951 A1* | 7/2012 | Kong | H03M 13/1515 |
| | | | 714/755 |
| 2013/0238955 A1 | 9/2013 | D'Abreu et al. | |
| 2014/0168811 A1* | 6/2014 | Yang | H03M 13/1111 |
| | | | 360/53 |
| 2017/0063394 A1* | 3/2017 | Halbert | G06F 11/1068 |
| 2017/0147433 A1* | 5/2017 | Shinbashi | G06F 11/1068 |

\* cited by examiner

SEMICONDUCTOR DEVICES

CROSS-REFERENCE TO RELATED APPLICATIONS

The present application claims priority under 35 U.S.C 119(a) to Korean Application number 10-2016-0078816 filed on Jun. 23, 2016, which is incorporated herein by reference in its entirety.

BACKGROUND

1. Technical Field

Embodiments of the present disclosure generally relate to integrated circuits, and more particularly to semiconductor devices that can detect data failures.

2. Related Art

Synchronous semiconductor devices may receive or transfer data signals and some command and address signals in synchronization with clock signals. Double data rate (DDR) synchronous semiconductor devices may receive or transfer data signals on both the rising edges and falling edges of the clock signal, and single data rate (SDR) synchronous semiconductor devices may receive or transfer data signals on rising edges of the clock signal.

SUMMARY

According to an embodiment, a semiconductor device may include a syndrome generation circuit and a failure detection circuit. The syndrome generation circuit may generate a syndrome signal corresponding to a pattern of an output data signal. The failure detection circuit may detect the syndrome signal and sequentially store the syndrome signal to generate a first syndrome signal and a second syndrome signal if an error is detected from the syndrome signal. The failure detection circuit may generate a failure detection signal which is enabled if a logic level combination of the first syndrome signal is different from a logic level combination of the second syndrome signal.

According to an embodiment, a semiconductor device includes a first latch, a second latch, and a latch data comparison circuit. The first latch may latch and store a syndrome signal to output the latched syndrome signal as a first latch syndrome signal in synchronization with a first pulse of a test signal, if an error included in an output data signal is detected by the syndrome signal. The second latch may latch and store the syndrome signal to output the latched syndrome signal as a second latch syndrome signal in synchronization with a second pulse of the test signal, if the error included in the output data signal is detected by the syndrome signal. The latch data comparison circuit may generate a failure detection signal which is enabled if a logic level combination of the first latch syndrome signal is different from a logic level combination of the second latch syndrome signal.

BRIEF DESCRIPTION OF THE DRAWINGS

Various embodiments of the present disclosure will become more apparent in view of the attached drawings and accompanying detailed description, in which.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
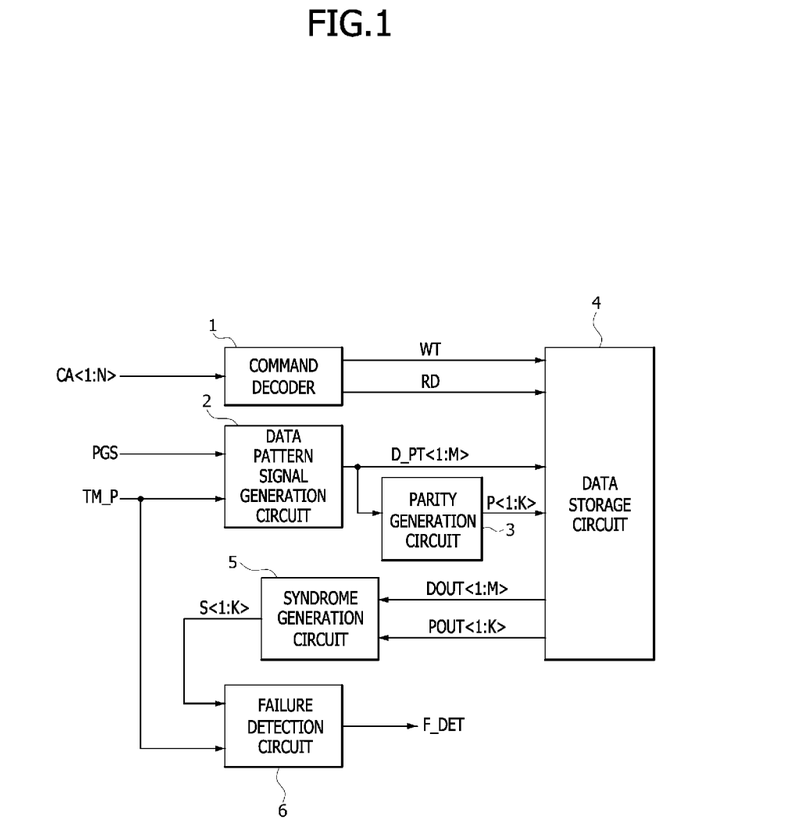
FIG. 1 is a diagram illustrating an example configuration of a semiconductor device according to an embodiment.

As illustrated in FIG. 1, a semiconductor device according to an embodiment may include a command decoder 1, a data pattern signal generation circuit 2, a parity generation circuit 3, a data storage circuit 4, a syndrome generation circuit 5, and a failure detection circuit 6.

The command decoder 1 may generate a write signal WT and a read signal RD in response to a command/address signal CA<1:N>. The command decoder 1 may decode the command/address signal CA<1:N> to generate the write signal WT and the read signal RD, one of which is selectively enabled. The command/address signal CA<1:N> may contain a command and an address. The command and the address may be transmitted through the same line as each other. Alternatively, the command and the address may be transmitted through different lines from each other. The write signal WT may be enabled for a write operation, and the read signal RD may be enabled for a read operation. The command/address signal CA<1:N> for enabling the write signal WT and the read signal RD may have various combinations of logic levels (e.g., combinations of logic high and logic low levels).

The data pattern signal generation circuit 2 may generate a data pattern signal D_PT<1:M> in response to a pattern generation start signal PGS and a test signal TM_P. In an embodiment, the pattern generation start signal PGS may be realized using a single bit included in the command/address signal CA<1:N>. When the pattern generation start signal PGS has a predetermined logic level, the data pattern signal generation circuit 2 may generate the data pattern signal D_PT<1:M> in response to a pulse of the test signal TM_P. Here, the data pattern signal D_PT<1:M> may have a data pattern that is set in response to the pulse of the test signal TM_P. The data pattern signal D_PT<1:M> may be realized such that its data pattern changes whenever the pulse of the test signal TM_P is input to the data pattern signal generation circuit 2. In some embodiments, the data pattern signal D_PT<1:M> may be realized such that its data pattern changes whenever two or more pulses of the test signal TM_P are input to the data pattern signal generation circuit 2.

The parity generation circuit 3 may generate a parity signal P<1:K> depending on the data pattern signal D_PT<1:M>. The parity generation circuit 3 may execute logical operations on some selected bits in the data pattern signal D_PT<1:M> to generate the parity signal P<1:K>. The parity signal P<1:K> may be generated using an error correction code (ECC) scheme utilizing a Hamming code.

The data storage circuit 4 may receive and store the data pattern signal D_PT<1:M> and the parity signal P<1:K>, and may output the data pattern signal D_PT<1:M> and the parity signal P<1:K> as an output data signal DOUT<1:M> and an output parity signal POUT<1:K> in response to the write signal WT and the read signal RD. The data storage circuit 4 may receive and store the data pattern signal D_PT<1:M> and the parity signal P<1:K> if the write signal WT is enabled. The data storage circuit 4 may include a storage circuit that stores the data pattern signal D_PT<1:M> and the parity signal P<1:K>. The data storage circuit 4 may output the stored data pattern signal D_PT<1:M> as the output data signal DOUT<1:M>, and may also output the stored parity signal P<1:K> as the output parity signal POUT<1:K> if the read signal RD is enabled.

The syndrome generation circuit 5 may receive the output data signal DOUT<1:M> and the output parity signal POUT<1:K> to generate a syndrome signal S<1:K> including information on errors found in the output data signal DOUT<1:M>. The syndrome signal S<1:K> may be generated using an ECC scheme utilizing a Hamming code. In an embodiment, if no error is found in the output data signal DOUT<1:M>, all of the bits in the syndrome signal S<1:K> may be set to a logic "low" level. In contrast, if an error is found in the output data signal DOUT<1:M>, at least one of the bits in the syndrome signal S<1:K> may be set to a logic "high" level. So long as the number of erroneous bits in the output data signal DOUT<1:M> is less than a predetermined number, the erroneous bits may be detected, and a logic level combination of the bits of the syndrome signal S<1:K> may be set differently according to embodiments.

The failure detection circuit 6 may generate a failure detection signal F_DET from the syndrome signal S<1:K> in response to the test signal TM_P. Whenever the pulse of the test signal TM_P is input, the failure detection circuit 6 may sequentially store first to $K^{th}$ syndrome signals included in the syndrome signal S<1:K> if at least one bit of the output data signal DOUT<1:M> is in error, and may compare the stored first to $K^{th}$ syndrome signals to generate the failure detection signal F_DET. If the failure detection signal F_DET is enabled, it may mean that a cell array (not illustrated) storing the output data signal DOUT<1:M> has a defective memory cell. Therefore, the failure detection signal F_DET may be used to repair the cell array including the defective memory cell. In this case, the failure detection signal F_DET may be transmitted to a memory controller (not illustrated) to provide information on whether the cell array has a defective memory cell.

Figure 2:
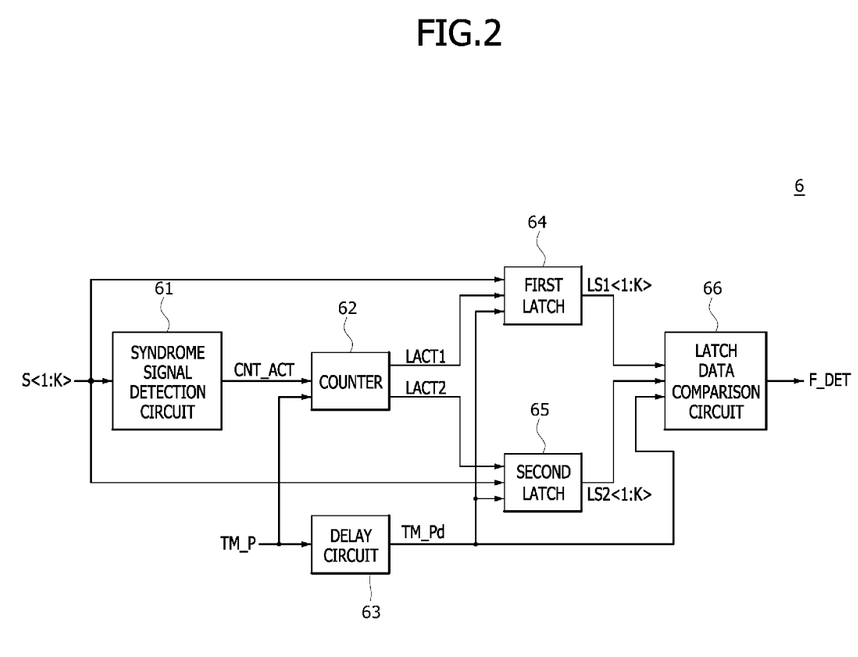
FIG. 2 is a diagram illustrating an example of a failure detection circuit included in the semiconductor device of FIG. 1.

Referring to FIG. 2, the failure detection circuit 6 may include a syndrome signal detection circuit 61, a counter 62, a delay circuit 63, a first latch 64, a second latch 65, and a latch data comparison circuit 66.

The syndrome signal detection circuit 61 may generate a counter activation signal CNT_ACT in response to the syndrome signal S<1:K>. The syndrome signal detection circuit 61 may detect the syndrome signal S<1:K> to generate the counter activation signal CNT_ACT which is enabled if the output data signal DOUT<1:M> is in error. In an embodiment, if at least one bit in the output data signal DOUT<1:M> is found to be erroneous, at least one bit in the syndrome signal S<1:K> may be set to a logic "high" level. Here, the counter activation signal CNT_ACT may be disabled if no error has been found in the output data signal DOUT<1:M>. In an embodiment, if there is no error in the output data signal DOUT<1:M>, all of the bits in the syndrome signal S<1:K> may be set to a logic "low" level.

The counter 62 may output a first latch active signal LACT1 and a second latch active signal LACT2 incrementing (or decrementing) in response to the counter activation signal CNT_ACT. The counter 62 may sequentially enable the first latch active signal LACT1 and the second latch active signal LACT2 if the counter activation signal CNT_ACT is enabled. The counter 62 may enable the first latch active signal LACT1 in odd-numbered enablement periods of the counter activation signal CNT_ACT, and the counter 62 may enable the second latch active signal LACT2 in even-numbered enablement periods of the counter activation signal CNT_ACT. Both of the first and second latch active signals LACT1 and LACT2 may be disabled to have a logic "low" level before the counter 62 operates.

The delay circuit 63 may delay the test signal TM_P by a predetermined period to generate a delayed test signal TM_Pd. The predetermined period by which the test signal TM_P is delayed may vary according to embodiments.

The first latch 64 may latch the syndrome signal S<1:K> in response to the delayed test signal TM_Pd and the first latch active signal LACT1. When a pulse of the delayed test signal TM_Pd is generated, the first latch 64 may latch and store the syndrome signal S<1:K> if the first latch active signal LACT1 is enabled. The first latch 64 may output the stored syndrome signal as a first latch syndrome signal LS1<1:K>. Based on the delayed test signal TM_Pd and the first latch active signal LACT1, the first latch syndrome signal LS1<1:K> may include bits that have a logic "low" level before the syndrome signal S<1:K> stored in the first latch 64 is output.

The second latch 65 may latch the syndrome signal S<1:K> in response to the delayed test signal TM_Pd and the second latch active signal LACT2. When a pulse of the delayed test signal TM_Pd is generated, the second latch 65 may latch and store the syndrome signal S<1:K> if the second latch active signal LACT2 is enabled. The second latch 65 may output the stored syndrome signal as a second latch syndrome signal LS2<1:K>. Based on the delayed test signal TM_Pd and the second latch active signal LACT2, the second latch syndrome signal LS2<1:K> may include bits that have a logic "low" level before the syndrome signal S<1:K> stored in the second latch 65 is output.

The latch data comparison circuit 66 may generate the failure detection signal F_DET from the first and second latch syndrome signals LS1<1:K> and LS2<1:K> in response to the delayed test signal TM_Pd. The failure detection signal F_DET may be enabled if a logic level combination of the first latch syndrome signal LS1<1:K> is inconsistent with a logic level combination of the second latch syndrome signal LS2<1:K> when a pulse of the delayed test signal TM_Pd is input to the latch data comparison circuit 66. The failure detection signal F_DET may be disabled if all bits in at least one of the first latch syndrome signal LS1<1:K> and the second latch syndrome signal LS2<1:K> have a logic "low" level. The failure detection signal F_DET may also be disabled if a logic level combination of the first latch syndrome signal LS1<1:K> is consistent with a logic level combination of the second latch syndrome signal LS2<1:K>.

Figure 3:
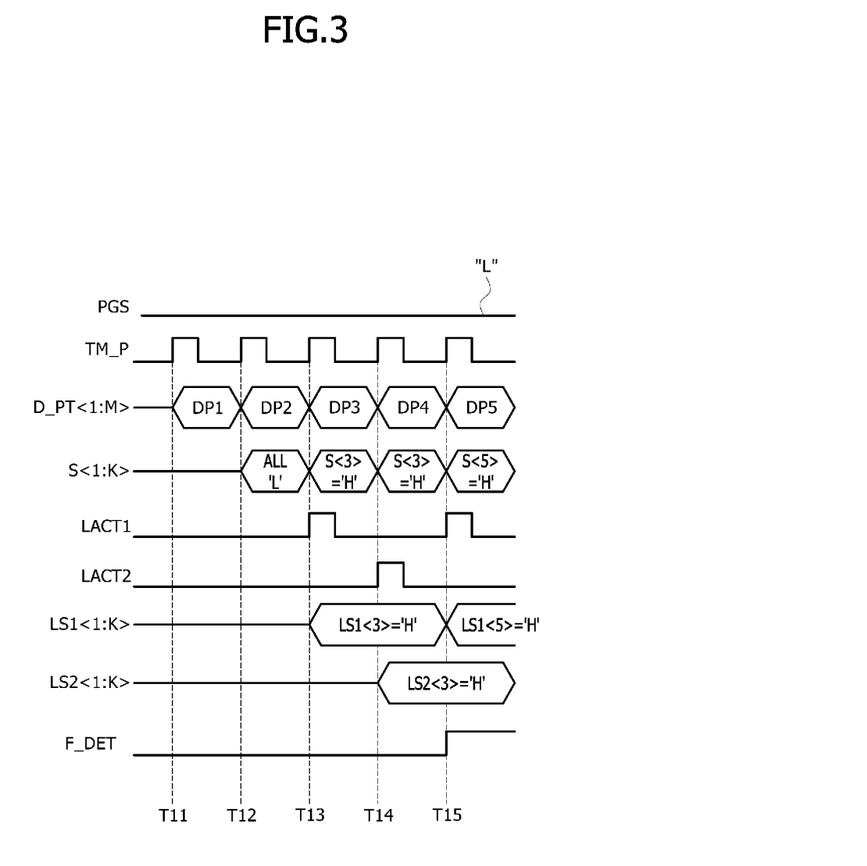
FIG. 3 is a timing diagram illustrating an example operation of the failure detection circuit illustrated in FIG. 2.

An operation of the semiconductor device having the aforementioned configuration will be described hereinafter with reference to FIG. 3.

Various patterns of the data pattern signal D_PT<1:M> may sequentially occur whenever the pulse of the test signal TM_P is generated while the pattern generation start signal PGS has a logic "low" level. That is, a first pattern DP1 of the data pattern signal D_PT<1:M> may occur at a first point in time T11, a second pattern DP2 of the data pattern signal D_PT<1:M> may occur at a second point in time T12, a third pattern DP3 of the data pattern signal D_PT<1:M> may occur at a third point in time T13, a fourth pattern DP4 of the data pattern signal D_PT<1:M> may occur at a fourth point in time T14, and a fifth pattern DP5 of the data pattern signal D_PT<1:M> may occur at a fifth point in time T15.

At the second point in time "T12", if all of the bits in the syndrome signal S<1:K> relating to the first pattern DP1 of the data pattern signal D_PT<1:M> have a logic "low" level, both of the first and second latch active signals LACT1 and LACT2 may still maintain a disabled state because the data pattern signal D_PT<1:M> has no erroneous bit.

At the third point in time T13, if only a third bit (i.e., a third syndrome signal S<3>) of the bits in the syndrome signal S<1:K> relating to the second pattern DP2 of the data pattern signal D_PT<1:M> has a logic "high" level, the first latch active signal LACT1 may have a logic "high" level because an error has been found in the data pattern signal D_PT<1:M>. The syndrome signal S<1:K> may be output as the first latch syndrome signal LS1<1:K>, and only the third syndrome signal S<3> of the syndrome signal S<1:K> is set to a logic "high" level. In such a case, the failure detection signal F_DET may still maintain a disabled state because all of the bits in the second latch syndrome signal LS2<1:K> have a logic "low" level.

At the fourth point in time T14, if only a third bit (i.e., a third syndrome signal S<3>) of the bits in the syndrome signal S<1:K> relating to the third pattern DP3 of the data pattern signal D_PT<1:M> has a logic "high" level, the second latch active signal LACT2 may have a logic "high" level because an error has been found in the data pattern signal D_PT<1:M>. The syndrome signal S<1:K> may be output as the second latch syndrome signal LS2<1:K>, and only the third syndrome signal S<3> of the syndrome signal S<1:K> is set to a logic "high" level. In such a case, the failure detection signal F_DET may still maintain a disabled state because only a third bit of each of the first and second latch syndrome signals LS1<1:K> and LS2<1:K> has a logic "high" level.

At the fifth point in time T15, if only a fifth bit (i.e., a fifth syndrome signal S<5>) of the bits in the syndrome signal S<1:K> relating to the fourth pattern DP4 of the data pattern signal D_PT<1:M> has a logic "high" level, the first latch active signal LACT1 may have a logic "high" level because an error has been found in the data pattern signal D_PT<1:M>. The syndrome signal S<1:K> may be output as the first latch syndrome signal LS1<1:K>, and only the fifth syndrome signal S<5> of the syndrome signal S<1:K> is set to a logic "high" level. In such a case, the failure detection signal F_DET may have a logic "high" level because a logic level combination of the first latch syndrome signal LS1<1:K> is inconsistent with a logic level combination of the second latch syndrome signal LS2<1:K>.

As described above, the semiconductor device according to an embodiment may continuously latch and store syndrome signals, and may generate a failure detection signal which is enabled if the latched syndrome signals have different logic level combinations. Even if erroneous bits in data pattern signals are corrected using an error correction code (ECC) scheme, additional errors may occur if the erroneous bits occurred at different locations (i.e., different bit numbers) of the data pattern signals. Accordingly, an embodiment of the present disclosure provides a method of detecting the latent failures.

Figure 4:
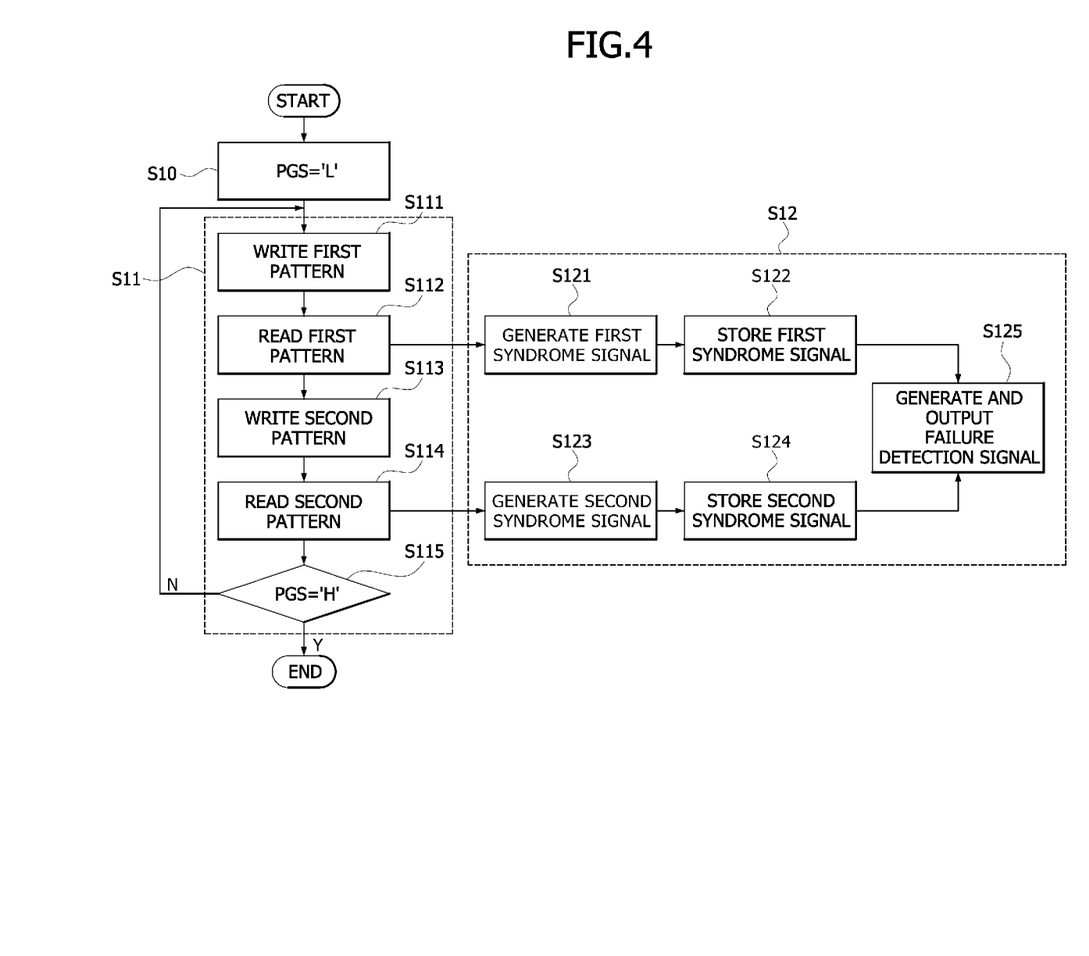
FIG. 4 is a flowchart illustrating an example operation of the failure detection circuit illustrated in FIG. 2.

An operation of the semiconductor device according an embodiment will be described hereinafter with reference to a flowchart of FIG. 4.

If the pattern generation start signal PGS is set to a logic "low" level, patterns of the data pattern signal D_PT<1:M> may be generated according to the test signal TM_P and a write operation, and a read operation may be performed on each of the patterns of the data pattern signal D_PT<1:M> (step S11). That is, after the write operation is performed to store the first pattern DP1 of the data pattern signal D_PT<1:M> into the data storage circuit 4 (step S111), the read operation may be performed to read out the first pattern DP1 stored in the data storage circuit 4 (step S112). Subsequently, after the write operation is performed to store the second pattern DP2 of the data pattern signal D_PT<1:M> into the data storage circuit 4 (step S113), the read operation may be performed to read out the second pattern DP2 stored in the data storage circuit 4 (step S114). The write operation and the read operation for storing and reading out each of the patterns of the data pattern signal D_PT<1:M> may be performed until a logic level of the pattern generation start signal PGS is changed into a logic "high" level.

The failure detection signal F_DET may be generated and output from the failure detection circuit 6 according to the syndrome signal generated by the write operation and the read operation performed on each of the patterns of the failure detection signal F_DET (step S12). More specifically, a first syndrome signal (e.g., the first latch syndrome signal LS1<1:K>) may be generated and stored in the failure detection circuit 6 if the read operation is performed to read out the first pattern DP1 during the step S112 (steps S121 and S122), and a second syndrome signal (e.g., the second latch syndrome signal LS2<1:K>) may be generated and stored in the failure detection circuit 6 if the read operation is performed to read out the second pattern DP2 during the step S114 (steps S123 and S124). If the locations of erroneous bits of the first and second patterns of the data pattern signal D_PT<1:M> are found to be different from each other after the first and second syndrome signals stored in the failure detection circuit 6 are compared with each other, the failure detection signal F_DET may be enabled because a defect is highly likely to exist in the semiconductor device (step S125).

The semiconductor device described with reference to FIGS. 1 to 4 may be applied to an electronic system that includes a memory system, a graphic system, a computing system, a mobile system, or the like. For example, as illustrated in FIG. 5, an electronic system 1000 according an embodiment may include a data storage circuit 1001, a memory controller 1002, a buffer memory 1003, and an input/output (I/O) interface 1004.

The data storage circuit 1001 may store data output from the memory controller 1002, or may output the stored data to the memory controller 1002 according to a control signal provided from the memory controller 1002. The data storage circuit 1001 may include the semiconductor device illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, or the nonvolatile memory may be a phase change random access memory (PRAM), a resistive random access memory (RRAM), a spin transfer torque random access memory (STTRAM), a magnetic random access memory (MRAM), or the like.

The memory controller 1002 may receive a command output from an external device (e.g., a host device) through the I/O interface 1004, and may decode the command output from the host device to control an operation for inputting data into the data storage circuit 1001 or the buffer memory 1003 or to control an operation for outputting the data stored in the data storage circuit 1001 or the buffer memory 1003.

Figure 5:
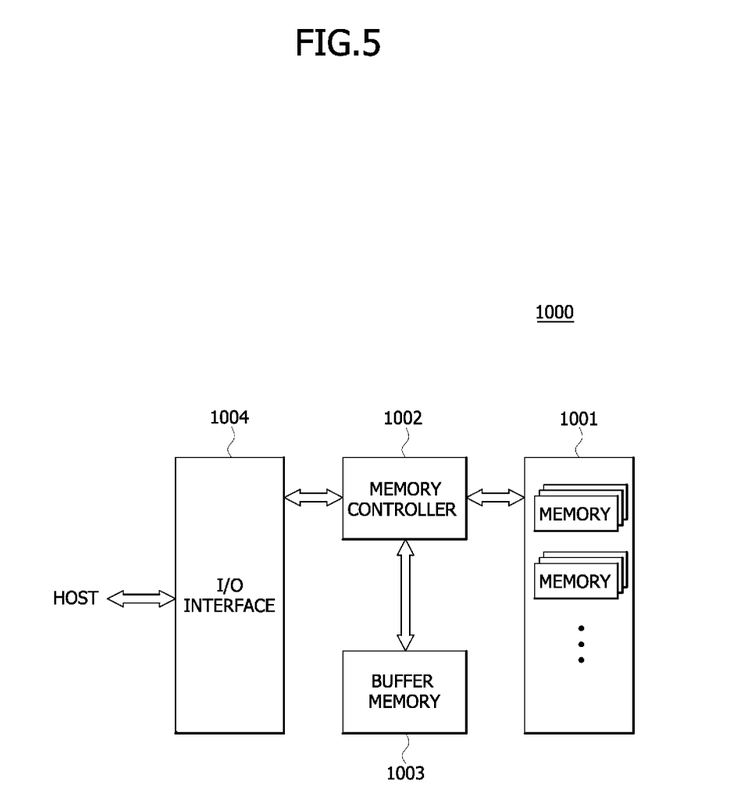
FIGS. 5 and 6 are diagrams illustrating example configurations of electronic systems employing the semiconductor device illustrated in FIG. 1.

Although FIG. 5 illustrates the memory controller 1002 as a single functional block, the memory controller 1002 may include two or more controllers, for example, one controller for controlling the data storage circuit 1001 comprised of a nonvolatile memory and another controller for controlling the buffer memory 1003 comprised of a volatile memory.

The buffer memory 1003 may temporarily store the data processed by the memory controller 1002. That is, the buffer memory 1003 may temporarily store the data output from the data storage circuit 1001, and may temporarily store the data to be input to the data storage circuit 1001. The buffer memory 1003 may store the data output from the memory controller 1002 according to a control signal. The buffer memory 1003 may output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data signals provided from the external device (i.e., the host) through the I/O interface 1004, and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 6:
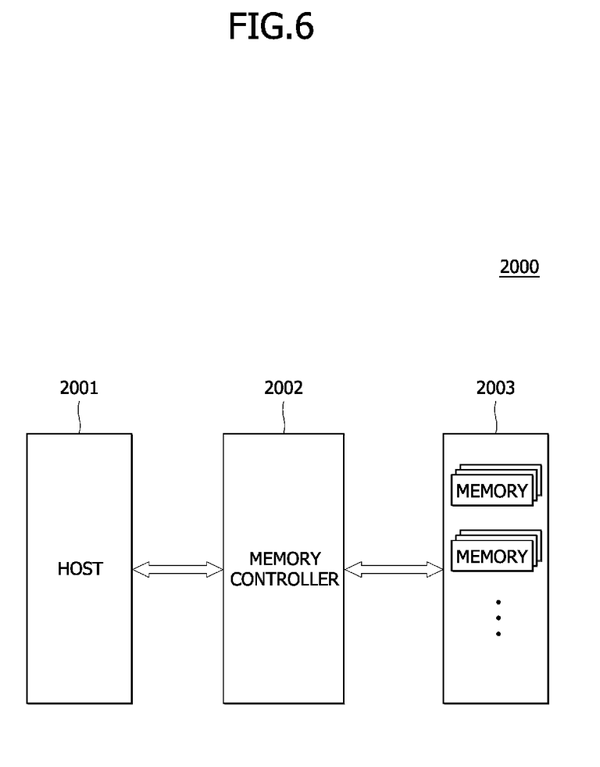

Referring to FIG. 6, an electronic system 2000 according an embodiment may include a host 2001, a memory controller 2002, and a data storage circuit 2003.

The host 2001 may output a request signal and data to the memory controller 2002 to access the data storage circuit 2003. The memory controller 2002 may supply data signals, data strobe signals, command signals, address signals and clock signals to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data output from the data storage circuit 2003 through the memory controller 2002. The host 2001 may include a circuit that corrects errors in the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001, and may generate and provide the data, the data strobe signal, the command, the addresses and the clock signal to the data storage circuit 2003 in order to control operations of the data storage circuit 2003. In addition, the memory controller 2002 may supply the data output from the data storage circuit 2003 to the host 2001.

The data storage circuit 2003 may include a plurality of memories. The data storage circuit 2003 may receive the data signals, the data strobe signals, the command signals, the address signals and the clock signals from the memory controller 2002 to execute the write operation or the read operation. Each of the memories in the data storage circuit 2003 may include a circuit that corrects the errors in the data using an error correction code (ECC) scheme. The data storage circuit 2003 may include the semiconductor device illustrated in FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a signal chip according to embodiments. The memory controller 2002 and the data storage circuit 2003 may be realized in a signal chip according to embodiments.

As described above, a semiconductor device according to an embodiment may also detect latent failures using syndrome signals which are generated by a write operation and a read operation that are alternately and repeatedly performed on various data patterns.

What is claimed is:
1. A semiconductor device comprising:
   a syndrome generation circuit configured to generate a syndrome signal corresponding to a pattern of an output data signal; and
   a failure detection circuit configured to detect the syndrome signal and sequentially store the syndrome signal to generate a first syndrome signal and a second syndrome signal if an error is detected from the syndrome signal, and the failure detection circuit generating a failure detection signal which is enabled if a logic level combination of the first syndrome signal is different from a logic level combination of the second syndrome signal.
2. The semiconductor device of claim 1, further comprising a data pattern signal generation circuit configured to sequentially generate and output a plurality of patterns of a data pattern signal corresponding to the output data signal, in response to a test signal.
3. The semiconductor device of claim 1, further comprising a data storage circuit configured to sequentially receive and store patterns of a data pattern signal during a write operation and output the stored patterns of the data pattern signal as the output data signal during a read operation.
4. The semiconductor device of claim 1, wherein the syndrome generation circuit generates the syndrome signal to correct an error in the output data signal.
5. The semiconductor device of claim 4, wherein the syndrome signal is generated from the output data signal using an error correction code (ECC) scheme utilizing a Hamming code.
6. The semiconductor device of claim 1, wherein, if the number of erroneous bits in the output data signal is less than a predetermined number, the syndrome generation circuit sets the logic level combination of the syndrome signal to correct the erroneous bits.

7. The semiconductor device of claim 1, wherein all bits in the syndrome signal are set to a predetermined logic level if no error is found in the output data signal.

8. The semiconductor device of claim 1, wherein the failure detection circuit stores the syndrome signal therein only if an error in the output data signal is detected by the syndrome signal.

9. The semiconductor device of claim 1, wherein the first and second syndrome signals correspond to a first latch syndrome signal and a second latch syndrome signal, respectively, and the failure detection circuit includes:
   a first latch configured to latch and store the syndrome signal to output the latched syndrome signal as the first latch syndrome signal in synchronization with a first pulse of a test signal, if an error in the output data signal is detected by the syndrome signal; and
   a second latch configured to latch and store the syndrome signal to output the latched syndrome signal as the second latch syndrome signal in synchronization with a second pulse of the test signal, if the error in the output data signal is detected by the syndrome signal.

10. The semiconductor device of claim 9, further comprising a latch data comparison circuit configured to compare a level of the first latch syndrome signal with a level of the second latch syndrome signal to generate the failure detection signal.

11. The semiconductor device of claim 10, wherein the latch data comparison circuit generates the failure detection signal which is disabled if all bits in at least one of the first and second latch syndrome signals have a predetermined logic level.

12. The semiconductor device of claim 10, wherein the failure detection circuit further includes a syndrome signal detection circuit configured to generate a counter activation signal which is enabled if an error in the output data signal is detected by the syndrome signal.

13. The semiconductor device of claim 12, wherein the failure detection circuit further includes a counter configured to generate a first latch active signal and a second latch active signal that increment to be sequentially enabled in response to the counter activation signal.

14. The semiconductor device of claim 13, wherein the first latch active signal activates the first latch, and the second latch active signal activates the second latch.

15. A semiconductor device comprising:
   a first latch configured to latch and store a syndrome signal to output the latched syndrome signal as a first latch syndrome signal in synchronization with a first pulse of a test signal, if an error in an output data signal is detected by the syndrome signal;
   a second latch configured to latch and store the syndrome signal to output the latched syndrome signal as a second latch syndrome signal in synchronization with a second pulse of the test signal, if the error in the output data signal is detected by the syndrome signal; and
   a latch data comparison circuit configured to generate a failure detection signal which is enabled if a logic level combination of the first latch syndrome signal is different from a logic level combination of the second latch syndrome signal.

16. The semiconductor device of claim 15, wherein the latch data comparison circuit generates the failure detection signal which is disabled if all bits in at least one of the first and second latch syndrome signals have a predetermined logic level.

17. The semiconductor device of claim 16, further comprising a syndrome signal detection circuit configured to generate a counter activation signal which is enabled if an error in the output data signal is detected by the syndrome signal.

18. The semiconductor device of claim 17, further comprising a counter configured to generate a first latch active signal and a second latch active signal that increment to be sequentially enabled in response to the counter activation signal.

19. The semiconductor device of claim 18, wherein the first latch active signal activates the first latch, and the second latch active signal activates the second latch.

20. The semiconductor device of claim 15, wherein the syndrome signal is generated from the output data signal using an error correction code (ECC) scheme utilizing a Hamming code.

* * * * *